United States Patent

Ohmi

[11] Patent Number: 5,944,907
[45] Date of Patent: Aug. 31, 1999

[54] CLEANING DEVICE AND METHOD

[76] Inventor: Tadahiro Ohmi, 1-17-301, Komegabukuro 2-chome, Acba-ku, Sendai, Miyogi-ken, Japan, 980

[21] Appl. No.: 08/894,996
[22] PCT Filed: Mar. 5, 1996
[86] PCT No.: PCT/JP96/00526
   § 371 Date: Sep. 4, 1997
   § 102(e) Date: Sep. 4, 1997
[87] PCT Pub. No.: WO96/27898
   PCT Pub. Date: Sep. 12, 1996

[30] Foreign Application Priority Data

Mar. 6, 1995 [JP] Japan ................. 7-45982
May 2, 1995 [JP] Japan ................ 7-108840

[51] Int. Cl.⁶ .................................. B08B 7/00
[52] U.S. Cl. .................. 134/1.3; 134/1; 134/2; 134/3; 134/26; 134/28
[58] Field of Search ............... 134/1, 1.3, 2, 3, 134/26, 28, 29, 902

[56] References Cited

FOREIGN PATENT DOCUMENTS 561236   9/1993   European Pat. Off. .
2-164707 6/1990   Japan .
6-041770 2/1994   Japan .

OTHER PUBLICATIONS

Handbook of Semiconductor Wafer Cleaning Technology, Noyes Publications, pp. 28–67, 120–131, 141 and 142, 1993.

Isagava et al, Ultra Clean Surface Preparation Using Ozonated Ultrapure Water, Int. Conf. on Solid State Device and Materials, pp. 193–195, Aug. 1992.

Ohmi et al, Metallic Impurities Segregation at the Interface Between Si Wafer and Liquid during Wet Cleaning, J. Electrochem. Soc., vol. 139, No. 11, pp. 3317–3335, Nov. 1992.

Itano et al, Minimization of ParticleContamination during Wet Processing of Si Wafer, J. Electrochem. Soc., vol. 142, No. 3, pp. 971–978, Mar. 1995.

Miyamoto et al, Prevention of Microroughness Generation on the Silicon wafer Surface in Buffered Hydrogen Fluoride by a Surfactan Addition, J. Electrochem. Soc., vol. 141, No. 10, pp. 2899–2903, Oct. 1994.

*Primary Examiner*—Jill Warden
*Assistant Examiner*—Alexander Markoff
*Attorney, Agent, or Firm*—Randall J. Knuth

[57] ABSTRACT

A cleaning device comprising: a metallic vessel; a nickel fluoride layer formed on the internal surface of the vessel at least at that portion where a cleaning solution is contained; a carbon layer formed on the nickel fluoride layer, and a vibrator provided on the outer surface of the vessel.

A cleaning method comprising the first step of conducting cleaning with pure water containing ozone, the second step of conducting cleaning with a cleaning solution containing HF, $H_2O_2$, and/or $O_3$, $H_2O$, and a surfactant while applying vibration at a frequency of not less than 500 kHz; the third step of conducting cleaning with pure water, and the forth step of removing an oxide film.

16 Claims, 5 Drawing Sheets

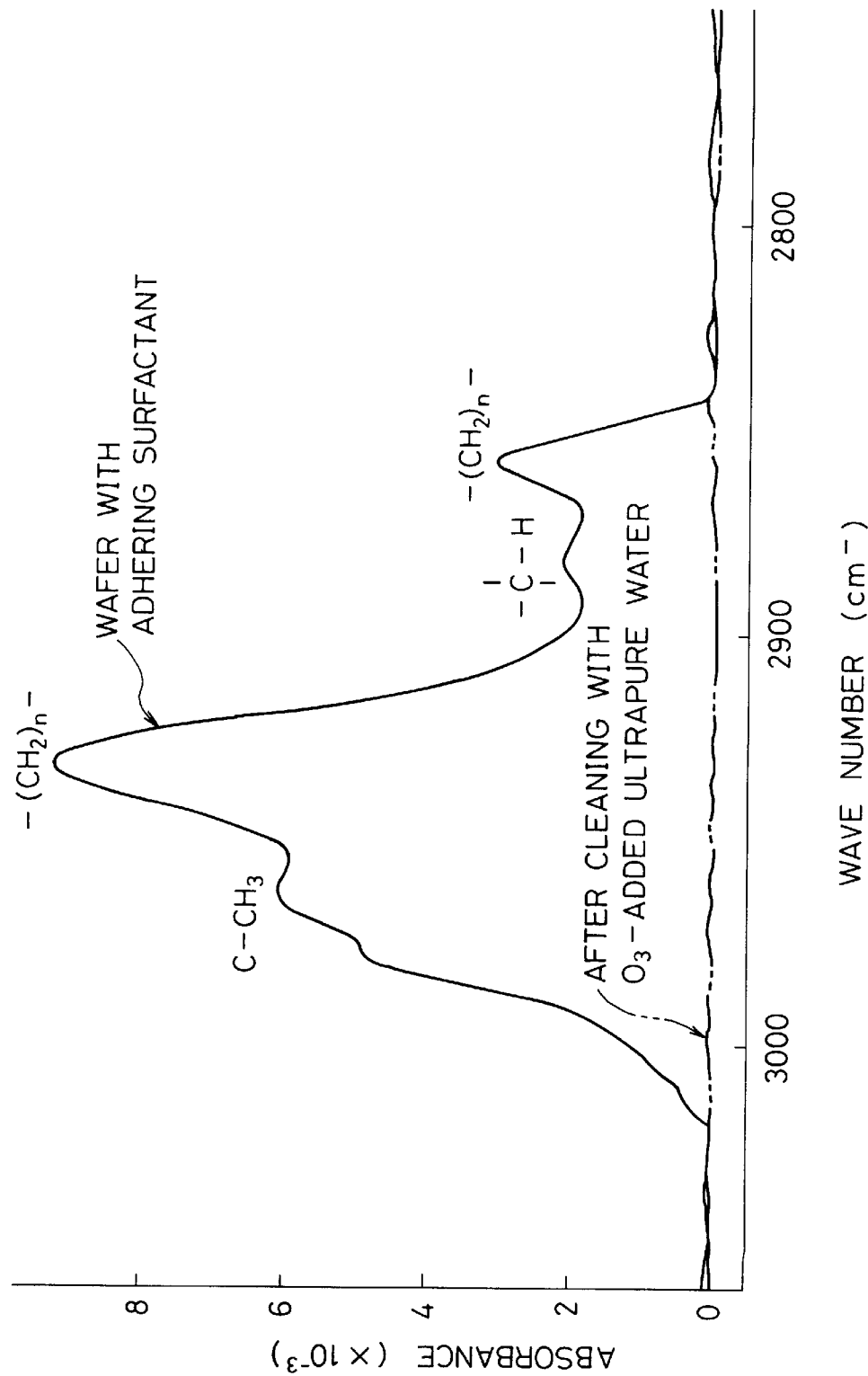

CLEANING DEVICE AND METHOD

The present application is a U.S. national stage of PCT/JP96/00526, filed Mar. 05, 1996.

BACKGROUND OF THE INVENTION

1. Field of the Invention.

The present invention relates to a cleaning device and cleaning method, and more particularly, relates to a cleaning device and cleaning method which make possible ultra-high purity cleaning using far fewer steps than in the prior art, and without conducting heating.

2. Description of the Related Art.

Recently, the semiconductor devices formed on semiconductor substrates have become highly dense and minute, reaching the submicron level. In order to achieve a high density, it is necessary to maintain the surface of the substrate in a state of ultra-high cleanliness. That is to say, it is necessary to remove, from the surface of the substrate, organic materials, metals, various types of particles, and oxides (oxide films). It is for this reason that the surface of the substrate is cleaned.

Conventionally, a cleaning method comprising the following steps was known as a cleaning technology for attaining a substrate surface in a state of ultra-high cleanliness.

(1) 98% $H_2SO_4$/305 $H_2O_2$ (at a 4:1 component ratio), temperature 130° C.

In this step, the organic materials and metals are removed.

(2) Cleaning with ultra-pure water at room temperature (3) Cleaning with dilute HF at room temperature By means of this step, the oxide film is removed.

(4) Cleaning with ultra-pure water; room temperature (5) 285 $NH_4OH$/ 30% $H_2O_2$/$H_2O$ (at a component ratio of 1:1:5); temperature of 80–90° C.;

By means of this step the particles are removed.

(6) Cleaning with ultra-pure water at room temperature.

(7) Cleaning with dilute HF at room temperature.

Since $H_2O_2$ is used in step (5) above, an oxide film is formed in step (5); therefore, in this step, the oxide film is removed.

(8) Cleaning with ultra-pure water at room temperature (9) 36% HCl/30% $H_2O_2$/$H_2O$ (a component ratio of 1:1:6); temperature 80–90° C. In this step, metal is removed.

(10) Cleaning with ultra-pure water at room temperature

(11) Cleaning with dilute HF at room temperature Since $H_2O_2$ is used in step (9) above, an oxide film is formed in step (9); therefore, this oxide film is removed in this step.

(12) Cleaning with ultra-pure water at room temperature

In the conventional cleaning method described above, the following problems are present:

A) The number of steps is extremely large, i.e., 12 steps;

B) The large amount of chemicals and water issued is large;

C) High temperature steps are included; and

D) Both acidic and alkaline chemicals are employed, so that the recovery of the chemicals is difficult.

Conventionally, the vessel used for the recovery of the cleaning solution of the cleaning device is made of glass or silica. However, since glass and silica are reactive with HF, it is necessary to employ a vessel made of resin when a cleaning solution containing HF is employed.

There are also cases in which cleaning is conducted while applying vibration from the exterior of the vessel to the material to be cleaned or to the cleaning solution. When a vessel is made of glass, silica, or metal, the vibration is transmitted sufficiently to the cleaning solution or the material to be cleaned within the vessel. However, when a vessel is employed which is made of resin, the vibration is absorbed by the resin and is attenuated, and is not sufficiently transmitted to the cleaning solution or the material to be cleaned within the vessel. Since, as described above, it is necessary to employ a vessel made of resin when a cleaning solution containing HF is employed, no technology existed conventionally in which cleaning was conducted while applying vibration when a cleaning solution containing HF was employed.

The present invention has as an object thereof to provide a cleaning method having an extremely small number of steps, in which treatment can be conducted using solely room temperature steps, which uses little chemicals and water, which only employs acids, and which offers easy recovery of the chemicals employed.

The present invention also has as an object thereof to provide a cleaning device which makes it possible to conduct cleaning while applying vibration even in the case in which a cleaning solution contain HF is employed.

SUMMARY OF THE INVENTION

In the cleaning device of the present invention, a nickel fluoride film is formed on the internal surface of a metallic vessel at least at that portion where a cleaning solution is contained, a carbon layer is formed on the nickel fluoride layer, and a vibrator is provided on the outer surface of the vessel.

Furthermore, in a further cleaning device in accordance with the present invention, a carbon layer is formed on the internal surface of a metallic vessel at least at that portion where a cleaning solution is contained, a fluorocarbon layer is formed on the carbon layer, and a vibrator is attached to the outer surface of the vessel.

The cleaning method of the present invention comprises the following steps: a first step in which cleaning is conducted using pure water containing ozone, a second step in which cleaning is conducted with a cleaning solution containing at least one of a group of (HF, $H_2O_2$ and/or $O_3$, $H_2O$), and a surfactant, while applying vibration at a frequency of not less than 500 kHz, a third step, in which cleaning is conducted using pure water, and a fourth step, in which an oxide film is removed.

Hereinbelow, the function of the present invention will be explained, together with the process by which the present invention was developed and the knowledge gained during that process.

BRIEF DESCRIPTIONS OF THE DRAWINGS

The above-mentioned and other features and advantages of this invention, and the manner of attaining them, will become more apparent and the invention will be better understood by reference to the following description of an embodiment of the invention taken in conjunction with the accompanying drawings wherein:

FIG. 5 is a graph showing the experimental results in the fifth embodiment.

Corresponding reference characters indicate corresponding parts throughout the several views. The exemplification set out herein illustrates one preferred embodiment of the invention in one form, and such exemplification is not to be construed as limiting the scope of the invention in any manner.

DETAILED DESCRIPTION OF THE INVENTION

Figure 1:
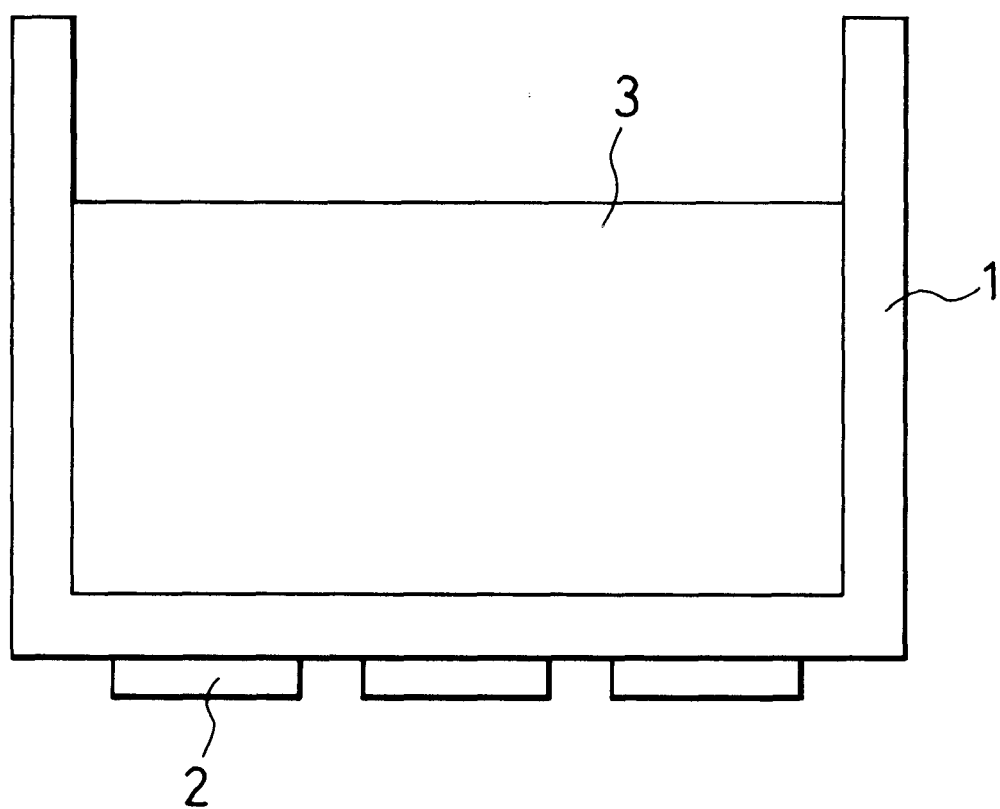
FIG. 1 is a conceptual diagram showing a cleaning device in accordance with an embodiment.

The present inventors conducted intensive research into a cleaning method having a small number of steps and which made possible treatment solely at room temperatures.

(A) Experiment 1

First, as an initial trial, experimentation was conducted using a mixed solution of HF, $H_2O_2$, and $H_2O$ (hereinbelow referred to as '$HF/H_2O_2/H_2O$'.)

As a result, the following was discovered.

1) Particles

The number of particles 1 $\mu$m or larger was reduced; however, the number of particles having a size within a range of 0.5–1 pm, as well as small particles having a size within a range of 0.3–0.5 plrt, were increased.

2) Metals

With respect to metals, a $10^{10}$ (number of atoms per $cm^2$) level was obtained; however, this was insufficient.

3) Organic Materials

Organic materials were removed to a point below the threshold of detection.

4) Oxide Film

The oxide film present prior to washing was removed; however, a separate oxide film was formed during the cleaning step.

Surface Roughness

When the surface was evaluated using $R_{ms}$ (center line mean square average roughness) after washing, the surface was found to be rough, at a $R_{ms}$ value of 0.23.

(B) Experiment 2

Further experimentation was carried out in order to solve the problems described in (A) above.

First, an experiment was performed in which a surfactant was added to the ($HF/H_2O_2/H_2O$) solution; the following results were obtained.

1) Particles

The number of large particles of 1 $\mu$m or more, and the number of particles within a range of 0.5–1 $\mu$m were dramatically reduced. However, although the number of small particles within a range of 0.3–0.5 $\mu$m did not increase, it did not decrease. In the final analysis, the removal of small particles within a range of 0.3–0.5 $\mu$m was unsatisfactory.

2) Metals

With respect to metals, a level of $10^9$ (number of atoms per $cm^2$) was reached; however, this was still not sufficient.

3) Organic Materials

Organic materials were removed to a point below the limit of detection.

4) Oxide Film

Although the oxide film which existed on the surface prior to cleaning was removed, another oxide film was formed during the cleaning process.

5) Surface Roughness

When the surface was evaluated in accordance with $R_{ms}$ (center line mean square average roughness) after cleaning, a level of $R_{ms}$=0.15 was attained, and this was satisfactory.

(C) Experiment 3

The tests described in (B) above were still not completely satisfactory. It was at this point that the present inventors changed their approach and conducted further experiments using this approach, which is described hereinbelow.

The present inventors have elsewhere disclosed a material in which a nickel fluoride layer is formed on a metal, and a carbon layer is then formed on the nickel fluoride layer (Japanese Patent Application No. Hei 6-288805). This material exhibited superior resistance to corrosion with respect to Hydrogen Fluoride, HF.

The present inventors evaluated the vibration transmission characteristics of this material, and discovered that in contrast to resins, this material exhibits superior vibration transmission characteristics.

At this point, the present inventors speculated that if a vessel for ($HF/H_2O_2/H_2O$/surfactant) cleaning solution were to be constructed from this material, a vibrator attached to the outer surface thereof, and vibration thereby applied during cleaning, there might be some effect. However, as described above, when a cleaning solution containing HF is employed, there was no conventional technology for conducting cleaning while applying vibration, so that the relationship between the application of vibration and cleaning effect when a cleaning solution containing HF was employed was unknown. That is to say, with respect to cleaning solutions containing HF, it was unknown if the cleaning effects would be improved or worsened when cleaning was conducted while applying vibration.

When this was conducted experimentally, it was discovered there was a significant difference between the case in which vibration was applied and that in which vibration was not applied; however, it was learned that it is not sufficient to simply apply vibration, and that the cleaning effects are not dependent on the strength (amplitude) of the vibration, but rather on the frequency thereof. It was discovered that the cleaning effects differ depending on the frequency. Then, an attempt was made to more concretely determine the frequency at which cleaning effects were generated, and it was determined that the specified cleaning effects were obtained when vibration having a frequency of 500 kHz or more was applied. That is to say, it was discovered that in the case in which an ($HF/H_2O/H_2O$/ surfactant) cleaning solution was employed, if cleaning was conducted while applying vibration having a frequency of 500 kHz or more, superior cleaning effects were obtained with respect to particles, metals, organic materials, removal of oxide films, and surface roughness.

However, it was learned that although the roughness was improved by adding a surfactant, undesirable variation was produced in the surface roughness when large scale treatment was conducted. The cause of this was unclear.

Attempts were made using various means to reduce this variation, and it was discovered that if cleaning was conducted using ultra-pure water containing ozone prior to the cleaning while applying a vibration using ($HF/H_2O_2/H_2O$/surfactant) solution, the variation described above was eliminated. The reason for this is unclear; however, it is thought that the amount of metal deposited on the surface of the substrate prior to conducting cleaning while applying vibration using ($HF/H_2O_2/H_2O$/surfactant) solution has some effect. That is to say, it is believed that if the amount of metal adhering is large, the surface roughness is large (rough), and it may be that the bulk of the adhering metals are removed by the cleaning using ultra-pure water containing ozone prior to the cleaning while applying vibration using ($HF/H_2O_2/H_2O$/surfactant) solution.

In the present invention, cleaning is first conducted using ultra-pure water containing ozone (the first step). In this first step, the bulk of the metals and organic material are removed. However, not all of these materials are removed. By means of conducting this first step, it is possible to reduce the variation in the surface roughness after all cleaning steps have been completed.

After the first step, it is possible to enter into the cleaning using ($HF/H_2O_2/H_2O$/surfactant) solution (the second step) without conducting ultra-pure water cleaning. In other words, it is possible to omit one ultra-pure water cleaning step. What is remaining on the surface of the substrate after the first step is ultra-pure water containing ozone, and this will not cause adverse effects even if the second step is initiated without removing this.

The second step involves cleaning using ($HF/H_2O_2/H_2O$/surfactant) solution while applying vibration having a frequency of 500 kHz or more; by means of this step, it is possible to remove particles, metals, and organic materials, and it is also possible to reduce the surface roughness.

Here, $O_3$ may be employed in place of the $H_2O_2$ or together with the $H_2O_2$.

In the second step, a cleaning solution containing surfactant is employed, so that after the completion of the second step, cleaning is conducted with ultra-pure water (rinsing), and the surfactant is removed from the surface of the substrate (the third step).

When the surfactant is not removed by this third step, a cleaning step using a solution containing ozone may be appropriately conducted prior to the initiation of the following step, and the surfactant may thus be completely removed. Since the types of chemicals employed are identical to those of the first step, it is not necessary to increase the types of chemicals which are managed.

In this second step, since a cleaning solution is employed which contains $H_2O_2$ (or $O_3$), an oxide film is formed after cleaning. The removal of this oxide film is conducted in the fourth step. For example, this may be accomplished by means of cleaning using a dilute HF solution and a subsequent cleaning (rinsing) using ultra-pure water.

Embodied Modes

Hereinbelow, embodied modes of the present invention will be explained.

The structure shown in FIG. 1 may be employed as the structure of the cleaning device employed in the second step. In FIG. 1, reference 1 indicates the vessel, while reference 2 indicates a vibrator, and reference 3 indicates a cleaning solution.

If the materials used for the vessel are as given below, corrosion resistance will be obtained with respect to the cleaning solution employed in the second step, and superior vibration transmission characteristics will be obtained. The details thereof are as given in the above reference to Japanese Patent Application No. Hei 6-288805.

A nickel/phosphorus plating layer is formed on the surface of the metal, and then the fluoridation of the nickel/phosphorus layer is conducted using fluoride, and then heat treatment is conducted in an inert gas (for example, nitrogen gas) atmosphere to form a nickel fluoride layer. Furthermore, this nickel fluoride layer is brought into contact with hydrocarbon gas and a carbon layer is formed (this is termed carbon treatment). Depending on the reaction conditions, some of the nickel fluoride may remain, or all may be replaced by carbon.

The temperature of the carbon treatment using hydrocarbons is within a range of room temperature to 400° C., and preferably within a range of 200° to 370° C. The period of the carbon treatment using hydrocarbons is within a range of 1 to 5 hours. The atmosphere employed in the carbon treatment may be solely hydrocarbon gas, or preferably, this gas may be appropriately diluted with an inert gas, for example, $N_2$, Ar, He, or the like.

There are cases in which fluoridation (termed fluorocarbon treatment) is conducted after the carbon treatment. The temperature of the fluorocarbon treatment is within a range of room temperature to 300° C., and preferably within a range of 100° to 250° C. The period of the fluorocarbon treatment is within a range of from a few minutes to 5 hours. It is preferable that the atmosphere in which the fluorocarbon treatment is conducted be in a state such that no oxygen is present, and accordingly, it is preferable that the atmosphere consist of either fluoride alone, or fluoride appropriately diluted with inert gases, such as, for example, $N_2$, Ar, He, and the like. The fluorocarbon treatment is basically conducted at standard pressures; however, where necessary, the treatment may be conducted under increased pressures, and at such times, the pressure may be on the level of 2 atmospheres or less (gauge pressure). Furthermore, it is preferable that the heat treatment be conducted in an inert gas, such as $N_2$, Ar, He or the like, and by means of conducting the heat treatment at a temperature within a range of 100° to 400° C., and preferably within a range of 200° to 370° C., and for a period of 1 to 5 hours, a fluorocarbon layer is formed which is durable and minute, has good adherence with the metal, and which exhibits sufficient corrosion resistance.

Metals which may be employed include stainless steel, nickel, aluminum, or alloys of these with other metals, and nickel/phosphorus plating may also be executed on the surface of these metals.

The thickness of the nickel fluoride layer is preferably within a range of 10 nm to 1 $\mu$m, and a range of 100 nm to 200 nm is further preferable.

The carbon layer is preferably within a range of 1 nm to 1 $\mu$m, and a range of 100 nm to 500 nm is more preferable.

(First Step)

In the first step, cleaning is conducted using ultra-pure water containing ozone; it is preferable that the ozone concentration be 2 ppm or more. 2 ppm is thus the lower limit, and concentrations at this level or greater dramatically reduce the undesirable variation in the surface roughness after cleaning.

It is preferable that the ultra-pure water have a resistivity of 18.2 MΩ or more, a metal concentration of 1 ppt or less, and impurities on the level of a few ppb or less.

Second Step

The concentration of HF in the cleaning solution employed in the second step is preferably within a range of 0.5 to 10 wt %. When the concentration is 0.5 wt % or more, the etching rate of the oxides becomes faster. On the other hand, when the concentration is in excess of 10 wt %, the etching rate becomes saturated and does not increase further. Accordingly, the addition of further amounts would be meaningless, and the amount of chemicals employed would increase, and this is economically disadvantageous.

The concentration of $H_2O_2$ is preferably within a range of 0.1 to 20 wt %. When the concentration is 0.1 wt % or more, it is possible to conduct the removal of metals more efficiently. On the other hand, even when the concentration is in excess of 20 wt %, the oxidation rate does not change, while the amount of chemicals employed increases, and this is economically disadvantageous.

Furthermore, the concentration of $O_3$ is preferably 5 ppm or more.

With respect to the surfactant, anionic types, cationic types, and non-ionic types may all be employed. Furthermore, hydrocarbon systems, fluorocarbon systems, or the like may be employed. Non-ionic activators which serve to lower the surface tension of the solution are particularly preferable.

As described above, depending on the type of surfactant employed in the second step, there may be cases in which the surfactants can not be removed by the rinsing of the third step, and in such cases, cleaning should be undertaken with ultra-pure water to which ozone ($O_3$) has been added. In such cases, the number of steps is six.

The frequency of the vibration applied in the second step is set at 500 kHz or more; however, this frequency is preferably within a range of 1 MHz to 2 MHz. In this range, the cleaning effect is particularly dramatic.

Hereinbelow, embodiments of the present invention will be explained. It is of course the case that the scope of the present invention is in no way restricted to the embodiments described below.

Embodiment 1

A silicon wafer (4 inches in diameter) having a surface was immersed for a period of 10 minutes in an ultra-pure water solution containing an ozone concentration of 3 ppm, and thereby the first step was conducted.

Next, in order to evaluate the efficiency of removal of particles, which is one of the cleaning effects in the second step, polystyrene latex (PSL) particles having an average particle diameter of 0.22 µm were deposited, and subsequently, cleaning was conducted by means of 4 types of cleaning methods.

(1) DHF: comparative example
    0.5% HF solution
(2) FPM: comparative example
    (0.5% HF/10% $H_2O_2$/H20) solution
(3) FPMS: comparative example
    (0.5% HF/10% $H_2O_2$/$H_2O$/50 ppm surfactant)
(4) FPMS +MS: embodiment
    (0.5% HF/10% $H_2O_2$/$H_2O$/50 ppm surfactant) solution, application of vibration with frequency of 950 kHz at a power of 200 W (device of FIG. 1).

The cleaning period was 10 minutes in all of the cases (1) through (4) above, and the cleaning temperature was room temperature. Furthermore, the cleaning was accomplished by immersing the silicon wafer in the cleaning solution.

After cleaning, the number of adhering particles was evaluated using a particle counter.

Figure 2:
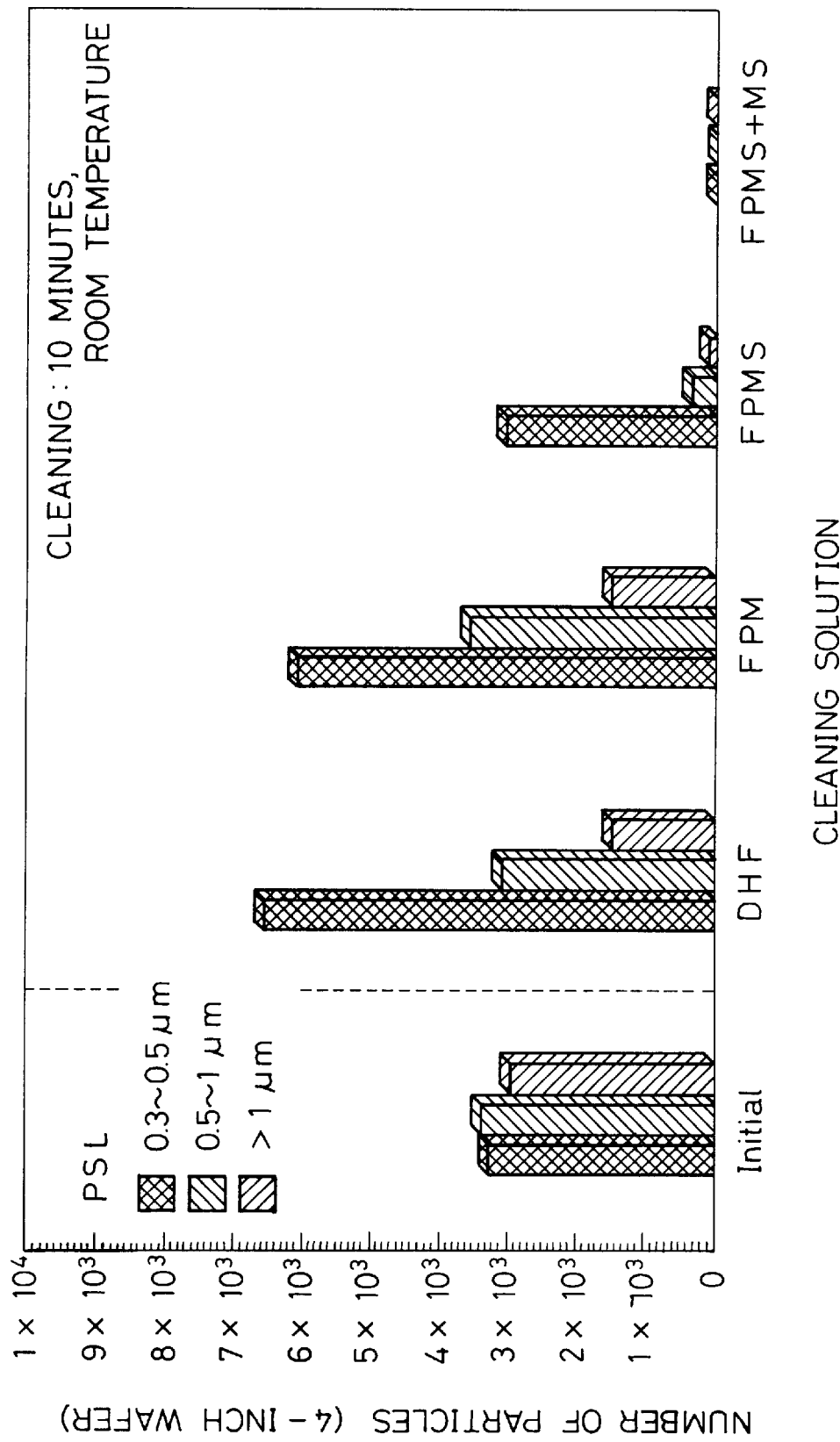
FIG. 2 is a graph showing the experimental results in the first embodiment.

The results the thereof are shown in FIG. 2.

As is shown in FIG. 2 the particle removal effects were slight in the comparative examples (1), (2), and (3); only in case (4), which is an embodiment of the present invention, were the particles removed at a removal rate of 99% or more.

Embodiment 2

In the present embodiment, a test was conducted in order to ascertain the efficiency of metal removal in the second step.

A silicon wafer (having a diameter of 8 inches) with a surface was immersed for a period of 3 minutes in ultra-pure water containing 20 ppm of ozone, and the first step was thus conducted. Next, this silicon wafer was immersed for a period of 3 minutes in ultra-pure water containing 1 ppm of $CuCl_2$, and cleaning was then conducted using ultra-pure water. By means of this, Cu was deposited on the surface of the silicon wafer at $10^{15}$ atoms/cm$^2$ as a metallic impurity (the initial state).

Next, the wafers were immersed in cleaning solution for a period of 10 minutes at room temperature using the various cleaning methods described in embodiment 1: (2) (comparative example), (3) (comparative example), and (4) (embodiment), and cleaning was conducted.

Figure 3:
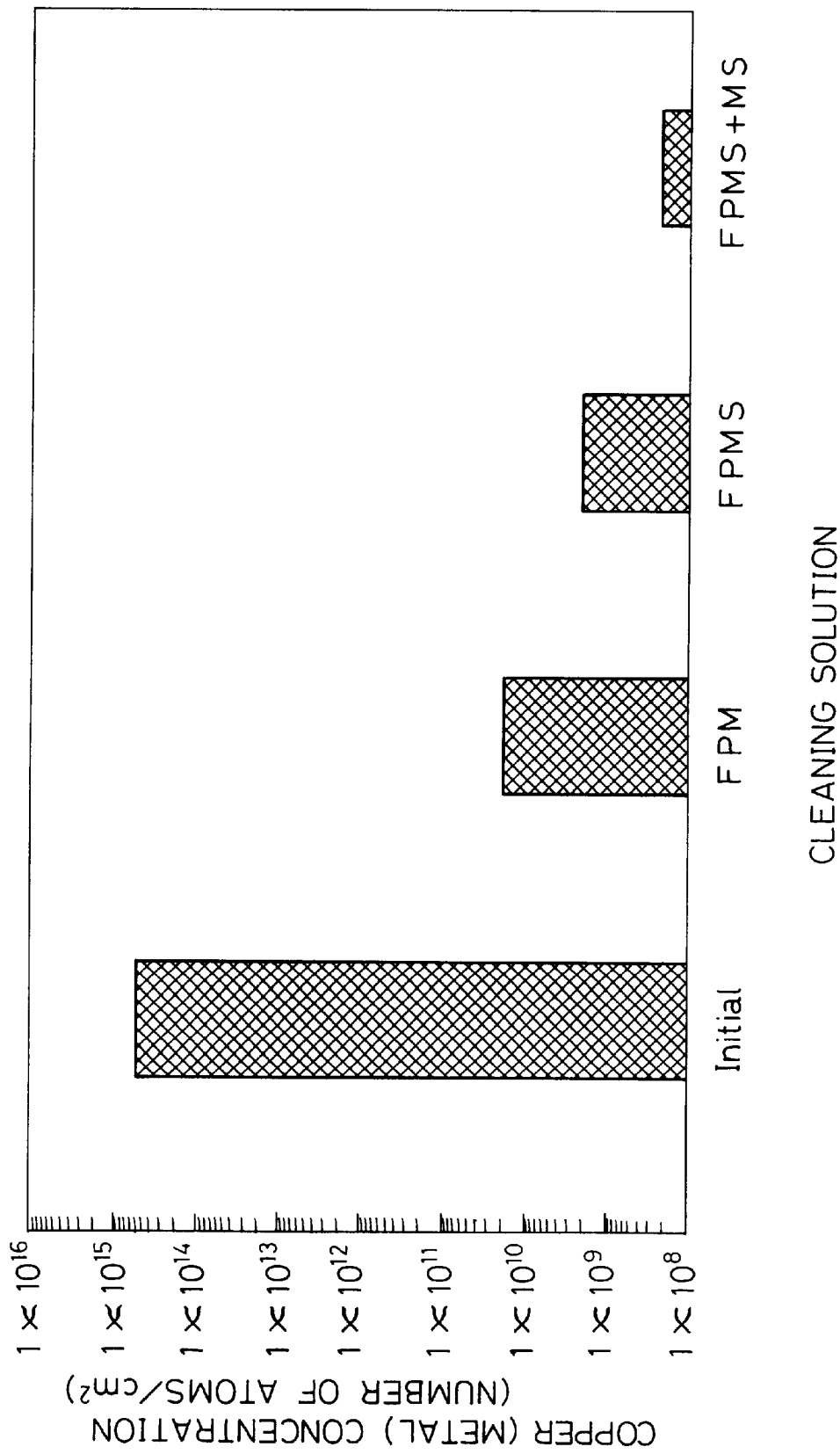
FIG. 3 is a graph showing the experimental results in the second embodiment.

Next, the amount of remaining Cu was measured using a total reflection fluorescence X-ray measurement apparatus. The results thereof are shown in FIG. 3.

The cases ((3), (4)) in which cleaning was conducted using solutions to which surfactant had been added showed a smaller amount of remaining Cu than the case ((2)) in which cleaning was conducted using a solution to which surfactant had not been added, so that a surfactant-induced metal attachment suppression effect can be seen.

Furthermore, by means of applying vibration, the metal attachment suppression effect can be made more dramatic.

Next, the surface roughness after cleaning was evaluated using an interatomic force microscope.

The surface roughnesses after cleaning were as given below.

(2) $R_{ms}$=0.23 nm
(4) $R_{ms}$=0.15 nm
  ($R_{ms}$: center line mean square average roughness):

It can be seen that it is possible to restrict the surface roughness by means of adding a surfactant.

Embodiment 4

A metal removal test was conducted by changing the amount of $H_2O_2$ present in the dilute HF/$H_2O_2$ within a range of 0.001 to 10 wt %. The HF concentration was fixed at 0.5 wt %.

Figure 4:
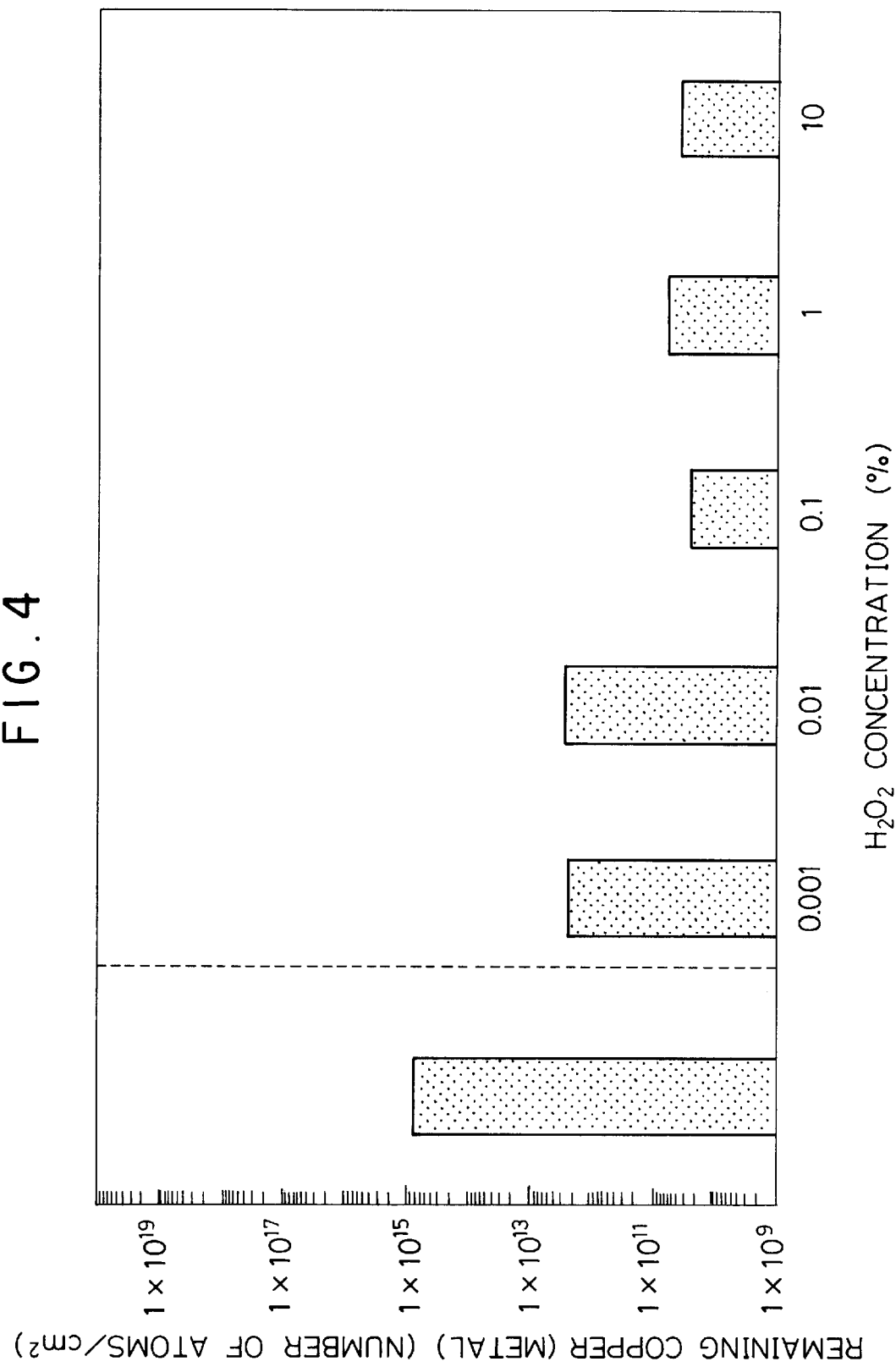
FIG. 4 is a graph showing the experimental results in the fourth embodiment.

With 0.1 wt % as a lower limit of the $H_2O_2$ concentration, the metallic removal dramatically increased at levels above this. Accordingly the $H_2O_2$ concentration is preferably 0.1 wt % or more. The results thereof are shown in FIG. 4.

Embodiment 5

Next, after surfactant which could not be removed with water cleaning was deposited on the silicon wafer, cleaning was conducted with ultra-pure water to which $O_3$ had been added, and it was determined whether the surfactant could be removed or not. The surfactant was deposited on the silicon wafer, and the state of attachment of the carbon was evaluated using a Fourier transform infrared spectrometer before and after cleaning with ultra-pure water to which $O_3$ had been added. In the case of the wafer on which surfactant had been deposited, absorbency was noted in the vicinity of 2,850–3,100 cm$^{-1}$, and the deposition of hydrocarbons was thus confirmed. However, in the case of a wafer which had been cleaned for 10 minutes using ultra-pure water to which $O_3$ had been added, absorbency was not noted in the same region, so that the surfactant was removed. These results are shown in FIG. 5.

Embodiment 6

In the present embodiment, 5 ppm of $O_3$ was employed in place of $H_2O_2$ in embodiment 1.

When $O_3$ was present at a level of 5 ppm, the remaining copper was less than $1\times10^{11}$/cm$^2$.

Industrial Applicability

In accordance with the present invention, the following effects were achieved.

(1) The process involves very few steps.

(2) Treatment is possible at room temperatures without conducting heating.

(3) The amount of chemicals and water employed is small.

(4) Only acids are employed as chemicals, so that recovery is a simple matter.

What is claimed is:

1. A cleaning method for a semiconductor substrate comprising the sequential steps of:

contacting a semiconductor substrate with pure water containing ozone, as a first step;

contacting the semiconductor substrate with a cleaning solution containing HF, $H_2O$, a surfactant, and at least one compound selected from the group comprising $H_2O_2$ and $O_3$, while applying a vibration having a frequency of at least approximately 500 Khz to said cleaning solution, as a second step;

contacting the semiconductor substrate with pure water as a third step; and removing an oxide film from the semiconductor substrate, as a fourth step.

2. The cleaning method in accordance with claim 1, wherein the ozone concentration in said first step is approximately 2 ppm or more.

3. The cleaning method in accordance with claim 1, wherein said frequency is approximately 1 MHz or more.

4. The cleaning method in accordance with claim 1, wherein a HF concentration of the cleaning solution is within a range of 0.5 to 10 wt %.

5. The cleaning method in accordance with claim 1, wherein the $H_2O_2$ concentration of the cleaning solution is within a range of 0.1 to 20 wt %.

6. The cleaning method in accordance with claim 1, wherein said surfactant is a non-ionic surfactant.

7. The cleaning method in accordance with claim 1, further comprising contacting the semiconductor substrate with a solution containing between said second step and said third step.

8. The cleaning method in accordance with claim 1, wherein said fourth step comprises contacting the semiconductor substrate with a HF solution with a range of 0.1 to 0.5 wt % and contacting the semiconductor substrate with pure water.

9. The cleaning method in accordance with claim 1, wherein the $O_3$ concentration in said second step is approximately 5 ppm or more.

10. The cleaning method in accordance with claim 2, wherein said frequency is approximately 1 MHz or more.

11. The cleaning method in accordance with claim 2, wherein an HF concentration of the cleaning solution is within a range of 0.5 to 10 wt %.

12. The cleaning method in accordance with claim 3, wherein an HF concentration of the cleaning solution is within a range of 0.5 to 10 wt %.

13. The cleaning method in accordance with claim 2, wherein an HF concentration of the cleaning solution is within a range of 0.1 to 20 wt %.

14. The cleaning method in accordance with claim 2, wherein an $H_2O_2$ concentration of the cleaning solution is within a range of 0.1 to 20 wt %.

15. The cleaning method in accordance with claim 3, wherein an $H_2O_2$ concentration of the cleaning solution is within a range of 0.1 to 20 wt %.

16. The cleaning method in accordance with claim 4, wherein the $H_2O_2$ concentration of the cleaning solution is within a range of 0.1 to 20 wt %.

* * * * *

UNITED STATES PATENT AND TRADEMARK OFFICE
CERTIFICATE OF CORRECTION

PATENT NO. : 5,944,907
DATED : August 31, 1999
INVENTOR(S) : Ohmi

It is certified that error appears in the above-identified patent and that said Letters Patent is hereby corrected as shown below:

On the cover page:

Please amend the inventor's address to read "Aoba-ku, Sendai-shi, Miyagi-ken 980-0813 JAPAN."

In the abstract:

In the second to the last line of the abstract, "forth" should read --fourth--.

In the claims:

In Claim 7 (column 10 line 5) after the word "containing" please insert --ozone is conducted--.

Signed and Sealed this

Second Day of May, 2000

*Attest:*

Q. TODD DICKINSON

*Attesting Officer*       *Director of Patents and Trademarks*